(12) United States Patent
Kawazoe et al.

(10) Patent No.: US 7,259,387 B2
(45) Date of Patent: Aug. 21, 2007

(54) NONVOLATILE SEMICONDUCTOR MEMORY DEVICE

(75) Inventors: Hidechika Kawazoe, Kitakatsuragi-gun (JP); Yukio Tamai, Fukuyama (JP); Atsushi Shimaoka, Kashihara (JP); Naoto Hagiwara, Gumma-gun (JP); Hidetoshi Masuda, Takasaki (JP); Toshimasa Suzuki, Takasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 27 days.

(21) Appl. No.: 11/035,592

(22) Filed: Jan. 13, 2005

(65) Prior Publication Data

US 2005/0151277 A1 Jul. 14, 2005

(30) Foreign Application Priority Data

Jan. 14, 2004 (JP) ............................. 2004-006321

(51) Int. Cl.
*H01L 47/00* (2006.01)
(52) U.S. Cl. .......................... 257/2; 257/63; 257/646; 257/E29.003; 257/E45.003; 365/148
(58) Field of Classification Search ...................... 257/2
See application file for complete search history.

(56) References Cited

U.S. PATENT DOCUMENTS

| 6,204,139 | B1 | 3/2001 | Liu et al. |
| 6,316,131 | B1 * | 11/2001 | Saboungi et al. ........... 428/800 |
| 6,473,332 | B1 | 10/2002 | Ignatiev et al. |
| 6,583,003 | B1 | 6/2003 | Hsu et al. |
| 2003/0148545 | A1 * | 8/2003 | Zhuang et al. .................. 438/3 |
| 2003/0156445 | A1 | 8/2003 | Zhuang et al. |
| 2004/0160804 | A1 * | 8/2004 | Rinerson et al. ............. 365/158 |
| 2004/0180542 | A1 * | 9/2004 | Nagashima et al. ......... 438/679 |

FOREIGN PATENT DOCUMENTS

EP  1 335 417 A2  8/2003

OTHER PUBLICATIONS

European Search Report completed on May 17, 2005 for EP Patent Application No. 05250075, 3 pages.

* cited by examiner

*Primary Examiner*—Tu-Tu V. Ho
(74) *Attorney, Agent, or Firm*—Morrison & Foerster LLP

(57) ABSTRACT

A nonvolatile memory element is formed by layering a lower electrode, a variable resistor and an upper electrode in sequence. The variable resistor is formed in which crystallinity and amorphism are mixed. Thus, the nonvolatile memory element is formed. More preferably, the variable resistor is a praseodymium-calcium-manganese oxide represented by a general formula, $Pr_{1-x}Ca_xMnO_3$, that has been formed at a film forming temperature from 350° C. to 500° C. Alternatively, the variable resistor is formed as a film at a film forming temperature that allows the variable resistor to become of an amorphous state or a state where crystallinity and amorphism are mixed and, then, is subjected to an annealing process at a temperature higher than the film forming temperature, in a temperature range where the variable resistor can maintain the state where crystallinity and amorphism are mixed.

5 Claims, 11 Drawing Sheets

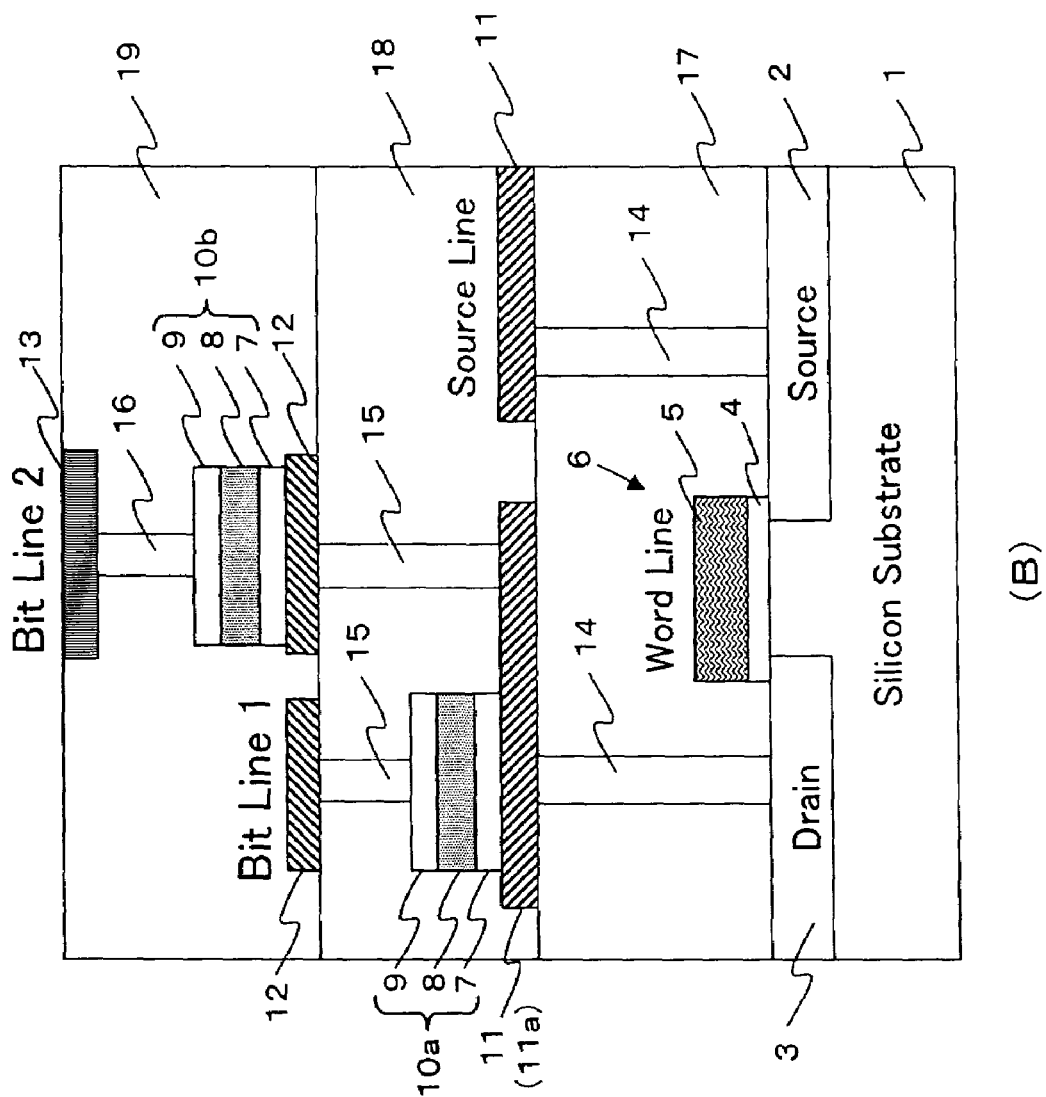
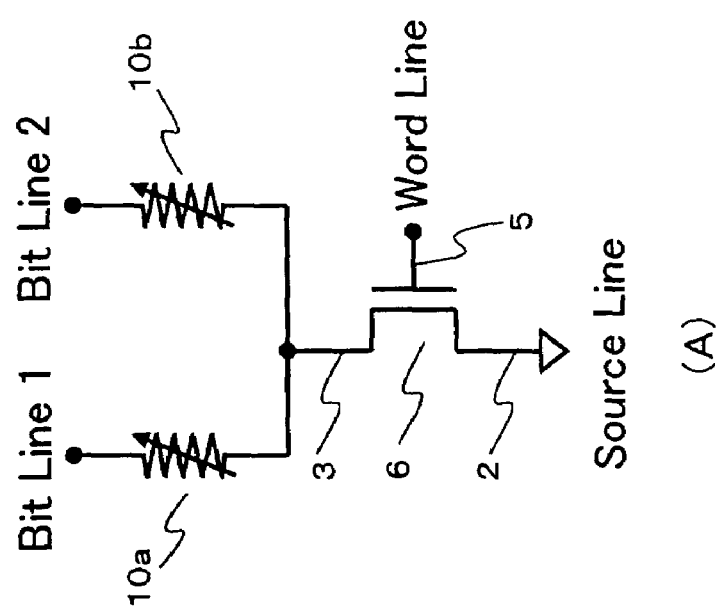
FIG. 4

| Process (after forming first layer metal interconnect) | Temperature |
|---|---|
| Pt Lower Electrode Deposition | <300°C |
| PCMO Film Sputtering | 350°C~500°C (420°C~500°C) |
| Pt Upper Electrode Deposition | <300°C |
| Pt/PCMO Film/Pt Patterning | <300°C |
| Interlayer Insulator Deposition | 400°C |
| Via Hole Photo/Etching | <300°C |
| Second-layer Metal Photo/Etching | <300°C |
| Second-layer Cu Interconnect Coating/Flattening | <300°C |
| Pt Lower Electrode Deposition | <300°C |
| PCMO Film Sputtering | 350°C~500°C (420°C~500°C) |
| Pt Upper Electrode Deposition | <300°C |
| Pt/PCMO Film/Pt Patterning | <300°C |
| Interlayer Insulator Deposition | 400°C |
| Via Hole Photo/Etching | <300°C |
| Third-layer Metal Photo/Etching | <300°C |
| Third-layer Cu Interconnect Coating/Flattening | <300°C |
| Interlayer Insulator Deposition | 400°C |
| Pad Open Photo/Etching | <300°C |
| Al Sputtering | <300°C |
| Al Pad Photo/Etching | <300°C |
| Hydrogen Sinter | 420°C |

FIG. 5

NONVOLATILE SEMICONDUCTOR MEMORY DEVICE

CROSS REFERENCE TO RELATED APPLICATIONS

This Nonprovisional application claims priority under 35 U.S.C. §119(a) on Patent Application No. 2004-006321 filed in Japan on Jan. 14, 2004, the entire contents of which are hereby incorporated by reference.

BACKGROUND OF THE INVENTION

1. Field of the Invention

The present invention relates to a nonvolatile semiconductor memory device and, more specifically, to a manufacturing method of a nonvolatile semiconductor memory device including a variable resistive element having a variable resistor made of a perovskite-type metal oxide film.

2. Description of the Related Art

In recent years, a variety of device structures such as an FeRAM (Ferroelectric RAM), an MRAM (Magnetic RAM) and an OUM (Ovonic Unified Memory) have been proposed as a next generation nonvolatile random access memory (NVRAM) that makes a rapid operation possible substituting a flash memory, and there has been a fierce competition for the development of such devices from the standpoint of increase in performance, increase in reliability, cost reduction and process matching. However, these memory devices at the present stage have their merits and demerits, and there is a long way to go before the realization of an ideal "universal memory" which has the respective merits of an SRAM, a DRAM and a flash memory.

The FeRAM, for example, which has already been put into practice, utilizes a spontaneous polarization inversion phenomenon of oxide ferroelectrics and is characterized by a low consumed power and a high speed operation; however, it is inferior due to high cost and destructive readout. A ferromagnetic tunnel effect element that utilizes giant magnetoresistance (GMR) used in the MRAM has a structure in that an extremely thin insulating layers (tunnel barrier layers) such as $Al_2O_3$ is placed between two ferromagnetic layers made of Fe, Co, Ni or the like. Herein, an amount of tunnel current flowing via the insulating layers can be controlled by changing the orientation of magnetization (spin) of the ferromagnetic layers, thus exhibiting a memory effect. This element has a large problem of high consumed power for magnetization inversion at the time of programming and of a difficulty in miniaturization. In addition, the OUM based on thermal phase transformation of a chalcogenide material is advantageous in low cost and process matching; however, it has a problem in miniaturization and in a high speed operation due to its thermal operation.

In addition to these existing technologies, a resistive random access memory (RRAM) device, that utilizes an electrical pulse induced resistance (EPIR) effect which is a new phenomenon in a colossal magnetoresistance (CMR) material, has been disclosed (see U.S. Pat. No. 6,204,139) by Shangquing Liu, Alex Ignatiev et al. of Houston University in the United States. The EPIR effect in a CMR material represented by a Mn-based oxide material having a perovskite-type structure is epoch-making where a change in resistance by several digits occurs at room temperature. The RRAM that utilizes this phenomenon has features in a low consumed power, a simple structure appropriate for miniaturization, easiness in a high integration and a wide dynamic range of a change in the resistance, and has excellent properties where a multiple value memory, which stores information of three or more values in a single memory element, is made possible. The memory element has an extremely simple basic structure where a lower electrode thin film, a CMR thin film and an upper electrode thin film are layered in sequence in the direction perpendicular to a substrate. According to the operation, the polarity, the voltage and the pulse width (widely ranging from several tens of ns to several μs) of the electrical pulse that is applied between the upper and the lower electrodes are controlled, so that the resistance of the CMR thin film that is placed between the upper and lower electrodes is changed. The resistance value that has been changed due to such a pulse application is maintained for a long period of time after the pulse application, and the performance of a nonvolatile memory element can be obtained by, for example, making the low resistance condition correspond to "0" and making the high resistance condition correspond to "1".

As the CMR material of an EPIR element, $Pr_{1-x}Ca_xMnO_3$ (PCMO), $La_{1-x}Ca_xMnO_3$, $La_{1-x}Sr_xMnO_3$, $Gd_{0.7}Ca_{0.3}BaCo_2O_{5+\delta}$ or the like, which have a perovskite structure, where the base is a network of oxygen octagons having a 3d transition metal element at its center, are typically used, and there has been reported that PCMO having the composition that is close to x=0.3 has the widest range of a change in the resistance value. As the electrode material, metal-based materials such as Pt, Ir, Ru, Ph, Ag, Au, Al and Ta and oxide- or nitride-based compounds such as $YBa_2Cu_3O_{7-x}$, $RuO_2$, $IrO_2$, $SrRuO_3$, TaSiN, TiN, TiSiN and MoN which have a conductivity higher than the CMR material are used and noble metal-based materials which are superior in mass production and form an excellent interface condition with the CMR layer, causing no problems with the electrical connection and which include metals in the platinum group such as Pt (lattice constant a=0.3923 nm), Ir (a=0.3839 nm), Rh (a=0.3803 nm) and Pd (a=0.389 nm) as well as Au (a=0.4079 nm) are appropriate.

The present inventors have diligently continued research on nonvolatile memory elements that utilize pulse electric field induced resistance variation of the perovskite-type metal oxide films. As a result, the present inventors have found that some elements perform a switching operation in the perovskite-type metal oxide film while others don't, and that the range of the initial resistance values of the elements which perform the switching operation is limited to a specific range. FIG. 1 shows this range of the initial resistance values.

The element used for obtaining the range of the initial resistance values in FIG. 1 includes a Pt lower electrode, a PCMO film (50 μm×50 μm, film thickness: 100 nm) and a Pt upper electrode, which are layered in sequence. The resistance value is measured through calculation from current values measured when 0.8 V is applied to the upper electrode. The voltage pulse applied to the upper electrode has a pulse width of 100 ns and a pulse amplitude of 2 V.

The determination of whether or not the variable resistance elements that have performed a switching operation are good is made by confirming reproducibility of the resistance variation in a manner that the ratio of variation in the resistance value is no less than 3 and the resistance value varies from a low resistance to a high resistance, again to a low resistance and again to a high resistance, in a pattern which is repeated no less than four times, at the time when pulses having the two polarities, positive and negative, are alternately applied in the manner +2V, −2V, +2V, −2V . . . Here, the ratio of variation in the resistance value is in a range from 1.3 to 1.5 for an MRAM, which is one of nonvolatile memory elements that have been developed in recent years. The conditions for determination of the ratio of variation in the resistance value in the PCMO film are stricter.

It has been found out from FIG. 1 that the initial resistance values of all of the measured elements are in a range from 1 kΩ to 1 GΩ, while the initial resistance values of the elements that have performed the switching operation are limited to a range from 4 kΩ to 2 MΩ. Though the range of the initial resistance values of the elements that perform the switching operation is from 4 kΩ to 2 MΩ in the example shown in FIG. 1, it has been confirmed that the range of the initial resistance values when performing the switching operation varies, depending on the pulse application voltage, the pulse width, the composition of the PCMO film, and the conditions for formation. Accordingly, it is necessary to control the initial resistance value of a variable resistance element to its appropriate value for operation of a nonvolatile semiconductor memory device, in order to obtain a variable resistance element that performs the switching operation.

SUMMARY OF THE INVENTION

The present invention is provided in view of the above problems, and the present inventors have, for the first time, clarified a structure of and a manufacturing method for a variable resistance element capable of controlling the initial resistance value of the variable resistance element. An object of the invention is to provide a nonvolatile semiconductor memory device formed of a nonvolatile memory element having a variable resistor made of a perovskite-type metal oxide film having an initial resistance value needed for an appropriate operation.

In order to achieve the above object, according to a first aspect of the present invention, a nonvolatile semiconductor memory device comprises: a variable resistance element having a variable resistor made of a perovskite-type metal oxide film, wherein the variable resistor in a state where crystallinity and amorphism are mixed is formed.

As for the relationship between the film forming temperature and the resistivity of a perovskite-type metal oxide film, in an example of a PCMO film as shown in FIG. 3, a high resistivity in the initial condition is obtained at a film forming temperature of 350 or 400° C. or less, and a low resistivity in the initial condition is obtained at a film forming temperature of 500° C. or more. That is, the PCMO film is in an amorphous state with a high resistance at film forming temperature of 350 or 400° C. or less, and is in a highly crystallized state with a low resistance at film forming temperature of 500° C. or more. In addition, the PCMO film in the state where crystallinity and amorphism are mixed is formed at film forming temperature between 350 or 400° C. and 500° C., the intermediate region of the above temperature regions. It can be seen that the resistivity greatly varies depending on the state of the mixture (mixture ratio).

Accordingly, in the nonvolatile semiconductor memory device according to the first aspect, the resistivity that determines the initial resistance value of the perovskite-type metal oxide film varies in accordance with its correlation with the crystal state of the variable resistor. Therefore, the variable resistor can be formed so as to have a crystal state where crystallinity and amorphism are mixed, by adjusting, for example, the film forming temperature, thus an initial resistance value needed for appropriate operation in accordance with the characteristics required for the variable resistance element can be set without changing the geometrical dimensions of the variable resistor, such as the film thickness.

According to a second aspect of the present invention, preferably, in the nonvolatile semiconductor memory device according to the first aspect, the variable resistance element includes a lower electrode, the variable resistor and an upper electrode, which are layered in sequence. With this structure, a predetermined voltage is applied between the lower electrode and the upper electrode, so that this voltage is applied to the variable resistor, which can change the resistance value of the variable resistor. Thus, the variable resistance element including the lower electrode, the variable resistor and the upper electrode can function as a nonvolatile memory element.

According to a third aspect of the present invention, more preferably, in the nonvolatile semiconductor memory device according to any of the above aspects, the variable resistor is a praseodymium-calcium-manganese oxide represented by a general formula, $Pr_{1-x}Ca_xMnO_3$, which has been formed at a film forming temperature from 350° C. to 500° C. A $Pr_{1-x}Ca_xMnO_3$ (PCMO) film formed at a film forming temperature from 350° C. to 500° C. is in a state where crystallinity and amorphism are mixed. Therefore, the nonvolatile semiconductor memory device can exhibit the working effects resulting from the first aspect while having properties of great resistance variation of the PCMO film.

According to a fourth aspect of the present invention, more preferably, in the nonvolatile semiconductor memory device according to any of the above aspects, the variable resistor is formed in a layer above the lowest metal interconnect layer. In the case where a memory cell is assumed to be formed of a variable resistance element and an active element such as a transistor, the variable resistance element and the transistor can be placed on top of each other; therefore, reduction in the size of the memory cell can be achieved. In addition, since the variable resistor can be formed in a process at a low temperature, thermal damage to the metal interconnect that has been placed in a lower layer can be avoided.

According to a fifth aspect of the present invention, more preferably, in the nonvolatile semiconductor memory device according to the first or second aspect, the variable resistor is formed at a film forming temperature so as to be in an amorphous state or in a state where crystallinity and amorphism are mixed and, then, is subjected to an annealing process at a temperature higher than the film forming temperature at which the variable resistor can maintain its state where crystallinity and amorphism are mixed. In the nonvolatile semiconductor memory device according to the fifth aspect, preferably, the film forming temperature is equal to or less than 500° C. Further, the variable resistor is a praseodymium-calcium-manganese oxide represented by a general formula, $Pr_{1-x}Ca_xMnO_3$.

In the nonvolatile semiconductor memory device according to the fifth aspect, since the initial resistance value of the variable resistor varies depending on the annealing process after the film-formation, it is possible to set an initial resistance value in the subsequent annealing process in a temperature range that allows the state where crystallinity and amorphism are mixed to be maintained, so as to make the variable resistance element appropriately operable in accordance with the required properties without changing the geometrical dimensions of the variable resistor, such as the film thickness, wherein a variable resistor having a resistance which is too low is avoided, even in the case where the variable resistor is in an amorphous state or in a state where crystallinity and amorphism are mixed, and has a resistance higher than the appropriate initial resistance value at the time of the film-formation.

BRIEF DESCRIPTION OF THE DRAWINGS

FIG. 4A is a diagram of an equivalent circuit showing an example of the configuration of a memory cell that is used in the nonvolatile semiconductor memory device according to the present invention, and FIG. 4B is a cross sectional diagram schematically showing the structure of the memory cell of FIG. 4A;

FIG. 5 is a table of steps showing examples of the processes after a process of forming a first layer metal interconnect for manufacturing a memory cell of the nonvolatile semiconductor memory device according to the present invention;

DESCRIPTION OF PREFERRED EMBODIMENTS

One embodiment of a nonvolatile semiconductor memory device according to the present invention (hereinafter, appropriately referred to as "inventive device") is described below with reference to the drawings.

Figure 2:
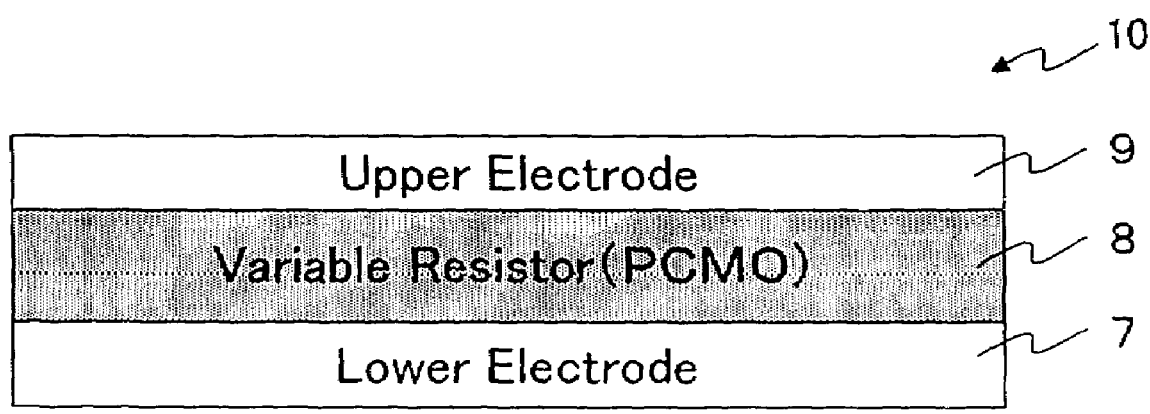
FIG. 2 is a cross sectional view schematically showing the basic structure of a variable resistive element that is used in a nonvolatile semiconductor memory device according to the present invention.

FIG. 2 is a cross sectional diagram showing the basic structure of a variable resistive element 10 which is a nonvolatile memory element used in an inventive device 100. The basic element structure of variable resistive element 10 is a layered structure where a lower electrode 7, a variable resistor 8 made of a perovskite-type metal oxide film, and an upper electrode 9 are layered in sequence.

As for the perovskite-type metal oxide that is used as the variable resistor 8, a great number of examples such as $Pr_{1-x}Ca_xMnO_3$ (PCMO), $Pr_{1-x}(Ca,Sr)_xMnO_3$, $Nd_{0.5}Sr_{0.5}MnO_3$, $La_{1-x}Ca_xMnO_3$, $La_{1-x}Sr_xMnO_3$ and $Gd_{0.7}Ca_{0.3}BaCo_2O_{5+\delta}$ are known. Among these, $Pr_{1-x}Ca_xMnO_3$-based materials, which have a large distortion in the network of the transition metal-oxide bonding and where a charge order phase is easily formed due to the suppression of charge transfer resulting from the distortion, exhibit a greater EPIR effect and moreover, the composition which is in the proximity of the phase border that is close to $x=0.3$ where a fusion phenomenon of the charge order phase easily occurs due to an external disturbance is preferable as the material used for the variable resistor 8 of the present invention that exhibits the EPIR effect.

As for the lower electrode 7, single noble metals including metals in the platinum group represented by Pt, Pd, Rh and Ir which have a high level of lattice matching with a perovskite-type metal oxide and have a high conductivity and a high resistance to oxidation and alloys between such noble metals as well as a variety of alloys of which the bases are these metals are preferable.

On the other hand, the upper electrode 9 is not necessarily subjected to an oxygen atmosphere at a high temperature; therefore, it is not limited to the above noble metal elements but rather a variety of materials such as Al, Cu, Ni, Ti and Ta, as well as oxide conductors are applicable. Here, a barrier layer may appropriately be inserted between the lower electrode and the base substrate in order to prevent reaction and to improve adhesion. In the case where an electrical connection is secured between the substrate and the lower electrode when a silicone substrate is used, for example, a significant conversion to an alloy occurs between Pt and Si; therefore, insertion of Ti, TiN, $Ti_{1-x}Al_xN$, TaN, TiSiN, TaSiN or the like, which has a conductivity and a barrier function, is effective. In the case where the substrate is coated with a $SiO_2$ layer, use of TiOx, $IrO_2$ or the like, which is an oxide causing no problems with the oxidation, is effective though the barrier layer mentioned above can be applied.

As for a technique for film formation of the lower electrode 7, a variety of techniques such as a sputtering method, a vacuum deposition method, an MOCVD (Metal Organic Chemical Vapor Deposition) method can be appropriately used, however a sputtering method, where parameter for film growth can be set in a wide range, is preferable from the standpoint of orientation control and stress control.

Figure 3:
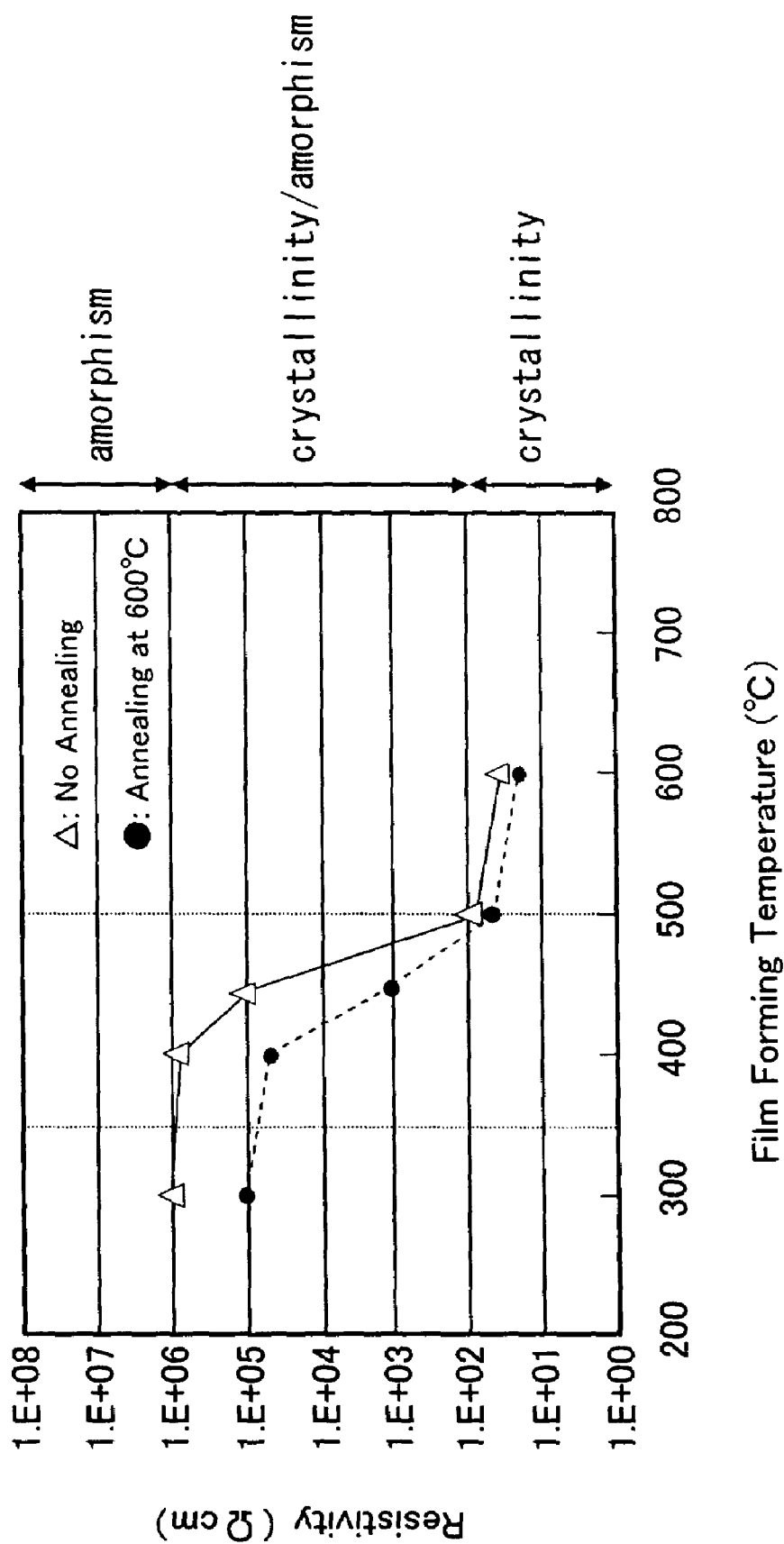
FIG. 3 is a graph showing the characteristic of the relationship between the film forming temperature by sputtering and the resistivity of a PCMO film in the case where the PCMO film is formed as an example of a variable resistor of the perovskite-type metal oxide film.

As for a technique for film formation of a perovskite-type metal oxide film that is used as the variable resistor 8, a sputtering method is used. FIG. 3 shows dependency of the resistivity of a PCMO film on the film forming temperature where the film has a high resistance at a film forming temperature of 350° C. or less. In the case of high resistance, a high voltage becomes necessary as the program and erasure voltage for the nonvolatile memory elements and may be higher than the operation voltage of the semiconductor integrated circuit. In addition, miniaturization of the nonvolatile memory elements causes an increase in the resistance. According to the present invention, the film forming temperature within a range from 350° C. to 500° C. is used, so that the initial resistance value can be adjusted to form a PCMO film which allows for a switching operation in a desired range of the operation voltage and which can still be formed in a low temperature process.

Figure 1:
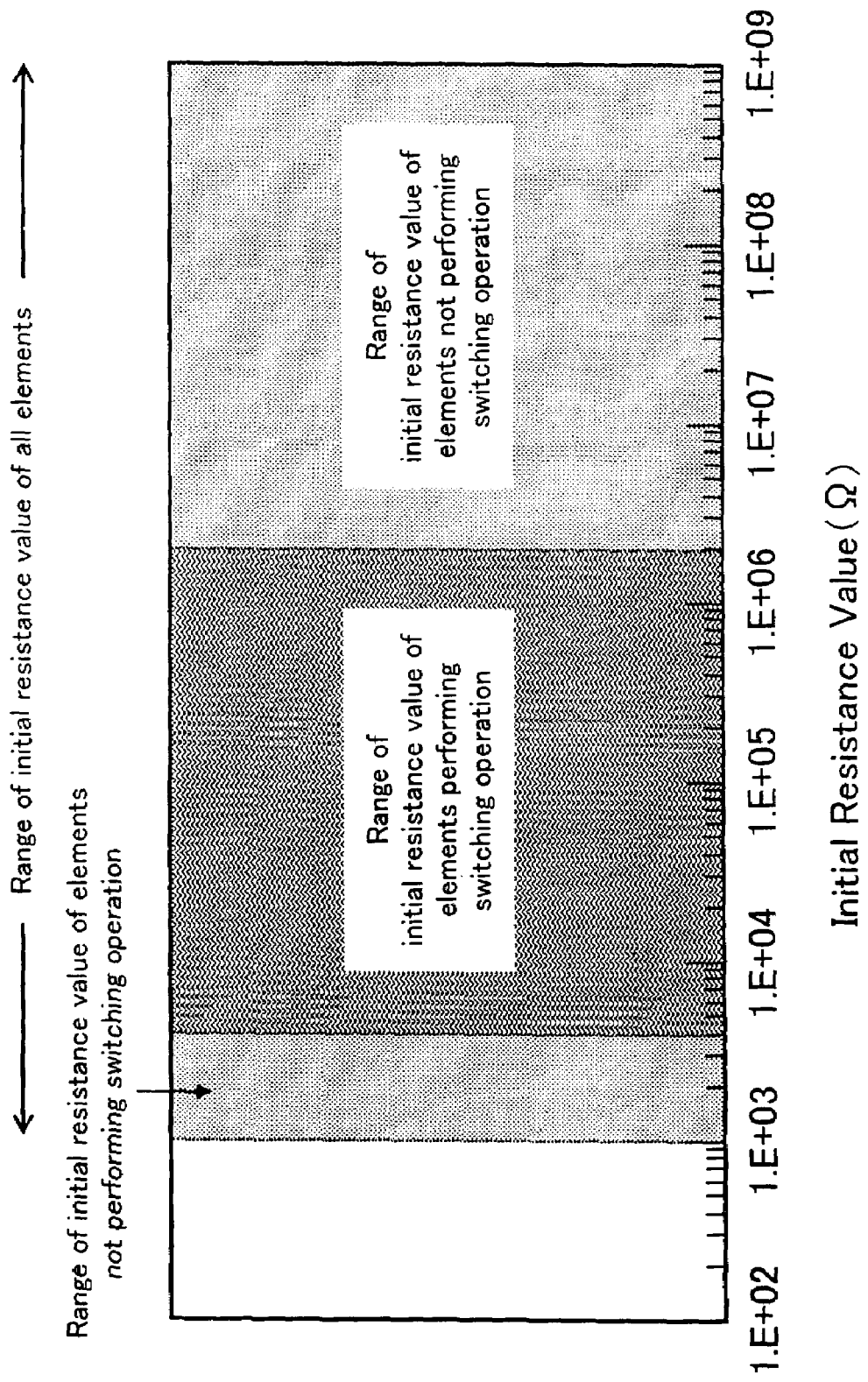
FIG. 1 is a graph showing a relation between an initial resistance value of a variable resistance element having a perovskite-type metal oxide film according to the present invention, and the appropriateness of a switching operation.

Variable resistance elements are fabricated in accordance with a film forming temperature of a PCMO film used as a parameter, and FIG. 3 shows the results of the measurements of the resistivity of these variable resistance elements. In the case of the present embodiment, a completely crystallized PCMO film is formed when the resistivity is 100 Ωcm or less, and a completely amorphous PCMO film is formed when the resistivity is 1 MΩcm or more. A PCMO film where crystallinity and amorphism are mixed is formed when the resistivity is in a range between 100 Ωcm to 1 MΩcm. As is clear from FIG. 3, it is possible to control the resistivity with the film forming temperature of the PCMO film; therefore, it is possible to obtain the initial resistance value of the variable resistance element that carries out a normal switching operation, as shown in FIG. 1, by adjusting the film forming temperature.

Next, a memory cell configuration which is provided with two variable resistive elements 10a and 10b as illustrated in FIG. 4 and which is formed by a process for three layers of metal interconnects is described. This memory cell is, as shown in the equivalent circuit of FIG. 4A, formed of the two variable resistive elements 10a and 10b and a selective transistor made of a MOSFET for selecting the memory cell. In this memory cell configuration, a selective transistor 6 is turned ON by means of the word line potential so as to select the memory cell, and in addition, a predetermined readout, program or erasure voltage is applied to one of two bit lines 1 and 2 and thereby, one of the variable resistive elements 10a and 10b is selected within the selected memory cell.

FIG. 4B shows the structure of a cross section of the configuration. The selective transistor 6 is formed of a source region 2 and a drain region 3 which are fabricated in a semiconductor substrate 1 and of a gate electrode 5 formed on a gate oxide film 4, where the drain region 3 is electrically connected to the respective lower electrodes 7 of the two variable resistive elements 10a and 10b. A first layer metal interconnect 11 is formed beneath two variable resistive elements 10a and 10 b, and a portion of the first layer metal interconnect 11 is connected to the source region 2 via a contact 14 so as to be used to form a source line and the other portion is connected to the drain region 3 via the contact 14 so as to be used as a relay electrode 11a for the two lower electrodes 7. A second layer metal interconnect 12 is formed above the variable resistive element 10a on the lower level and a portion of the second layer metal interconnect is connected to the upper electrode 9 of the variable resistive element 10a on the lower level via a first via 15 so as to be used to form the bit line 1 and the other portion is used to relay the lower electrode 7 of the variable resistive element 10a on the lower level and the relay electrode 11a. A third layer metal interconnect 13 is formed above the variable resistive element 10b on the upper level and is connected to the upper electrode 9 of variable resistive element 10b on the upper level via a second via 16 so as to be used to form the bit line 2. As described above, the two variable resistive elements 10a and 10b are formed above the selective transistor 6, thus enabling a high density integration of the memory cells. Here, the contacts 14 are provided in a first interlayer insulator 17 between the semiconductor substrate 1 and the first layer metal interconnect 11, the first vias 15 are provided in a second interlayer insulator 18 between the first layer metal interconnect 11 and the second layer metal interconnect 12 and the second via 16 is provided in a third interlayer insulator 19 between the second layer metal interconnect 12 and the third layer metal interconnect 13 in order to electrically connect the upper layer and the lower layer.

In the memory cell configuration illustrated in FIG. 4, the two variable resistive elements 10a and 10b are formed during the wiring processes for the three layers of the metal interconnects after the process of forming the transistor in the semiconductor integrated circuit. In the case where Cu interconnects, of which the specific resistance is lower than that of an Al interconnect, are utilized instead of Al interconnects of which the melting point is 660° C. that is too low in the wiring processes, Cu is easily diffused into the insulating layers at a high temperature; therefore, heat treatment at a temperature below the melting point of Al which is not more than 500° C., is carried out on the formation of the variable resistive elements 10a and 10b, including the formation of the electrodes, in order to prevent first and second layer metal interconnects 11 and 12 from being thermally damaged.

FIG. 5 shows an example of a process for fabricating the two variable resistive elements 10a and 10b in a semiconductor integrated circuit that has been manufactured in a process for metal interconnects of three layers where Cu interconnects are used as the second and third layer metal interconnects. The right column in the process table shown in FIG. 5 indicates treatment temperatures in the respective processes. In the present example of the process, Al pads are fabricated on the third layer metal interconnect. As is clear from FIG. 5, the maximum temperature after the process of forming the first interlayer insulator 17 and the first layer metal interconnect 11 is 420° C.; therefore, in the case where the film forming temperature of the PCMO film 8 is set in a range from 420° C. to 500° C., Cu can be suppressed from diffusing into the interlayer insulators and the PCMO film 8 that is not affected by heat treatment in the process for the formation of interlayer insulators and interconnects can be formed.

In addition, in the case where the film forming temperature of the PCMO film 8 is set at 420° C. or less, the initial resistance value of the PCMO film varies due to annealing triggered by a temperature for depositing the interlayer insulator, and heat treatment for $H_2$ sintering. As shown in FIG. 3, when an annealing process is carried out after the film-formation at 600° C., which is higher than the film forming temperature, the initial quality of the film of which the initial film forming temperature is 500° C. or less is either in the amorphous state or in the intermediate state, where amorphism and crystallinity are mixed. Therefore, the resistivity lowers due to the crystallization of the amorphous portion.

Therefore, according to a second method for forming the variable resistor 8, such as, a PCMO film, a variable resistor 8 is formed once so as to be in the amorphous state or in the intermediate state, where amorphism and crystallinity are mixed, at a film forming temperature which is lower than the film forming temperature for obtaining the initial resistance value, allowing the resistor to perform a switching operation within the range of a desired operational voltage, that is, the variable resistor is formed so as to be in a state having a resistance higher than the desired initial resistance value, and after that, an annealing process is carried out at a temperature higher than the film forming temperature so that the resistance can be lowered to the desired initial resistance value. In the variable resistance element 10 used for the inventive device 100, the variable resistor 8, which has been subjected to the annealing process, is maintained in an intermediate state, where amorphism and crystallinity are mixed; therefore, the state where amorphism and crystallinity are mixed can be controlled by appropriately controlling the annealing conditions (annealing temperature, period of time for annealing, or both of these). As a result, the resistance of the variable resistor can be reduced to the desired initial resistance value.

Figure 6:
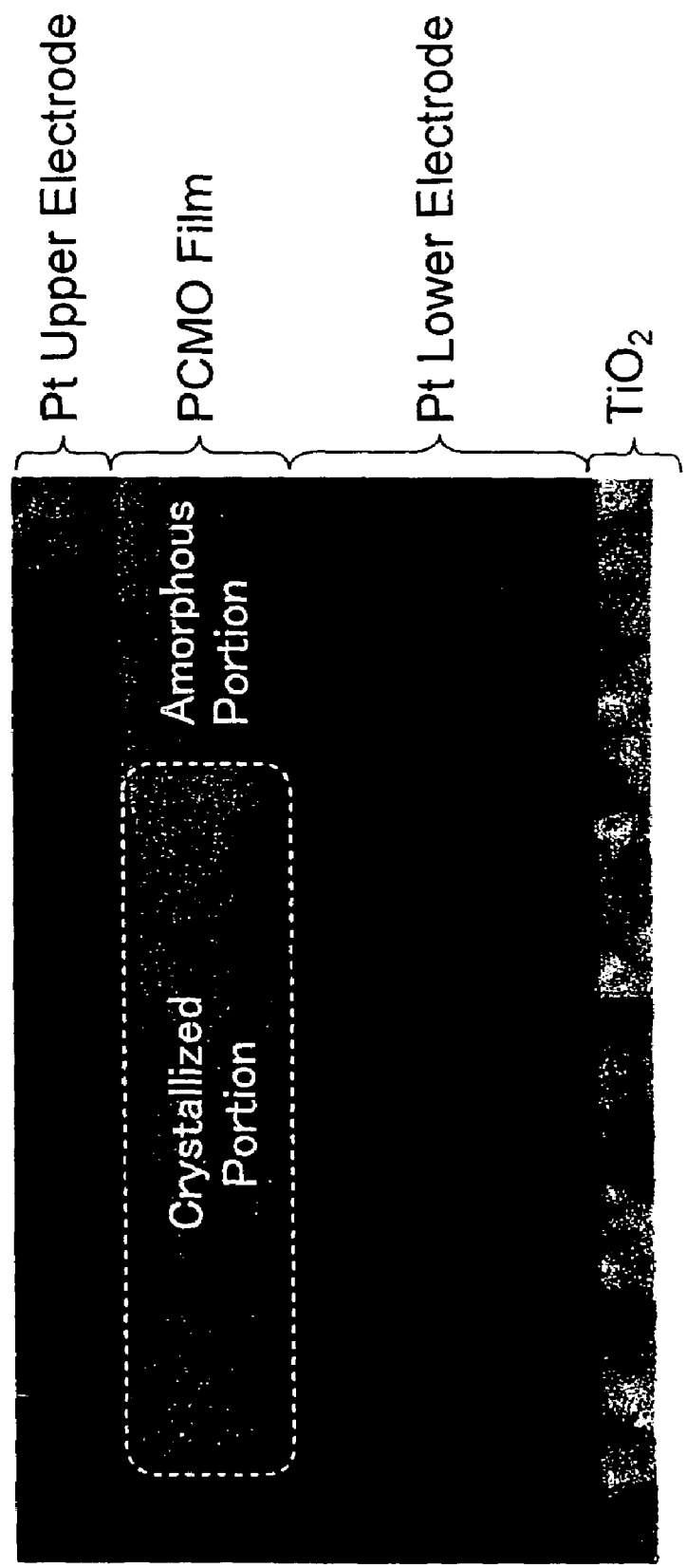
FIG. 6 is a cross-sectional TEM image of a variable resistance element in the case where a PCMO film is formed at 300° C. by a sputtering method and, then, is subjected to an annealing process at 500° C. for 15 minutes in an oxygen atmosphere.
Figure 7:
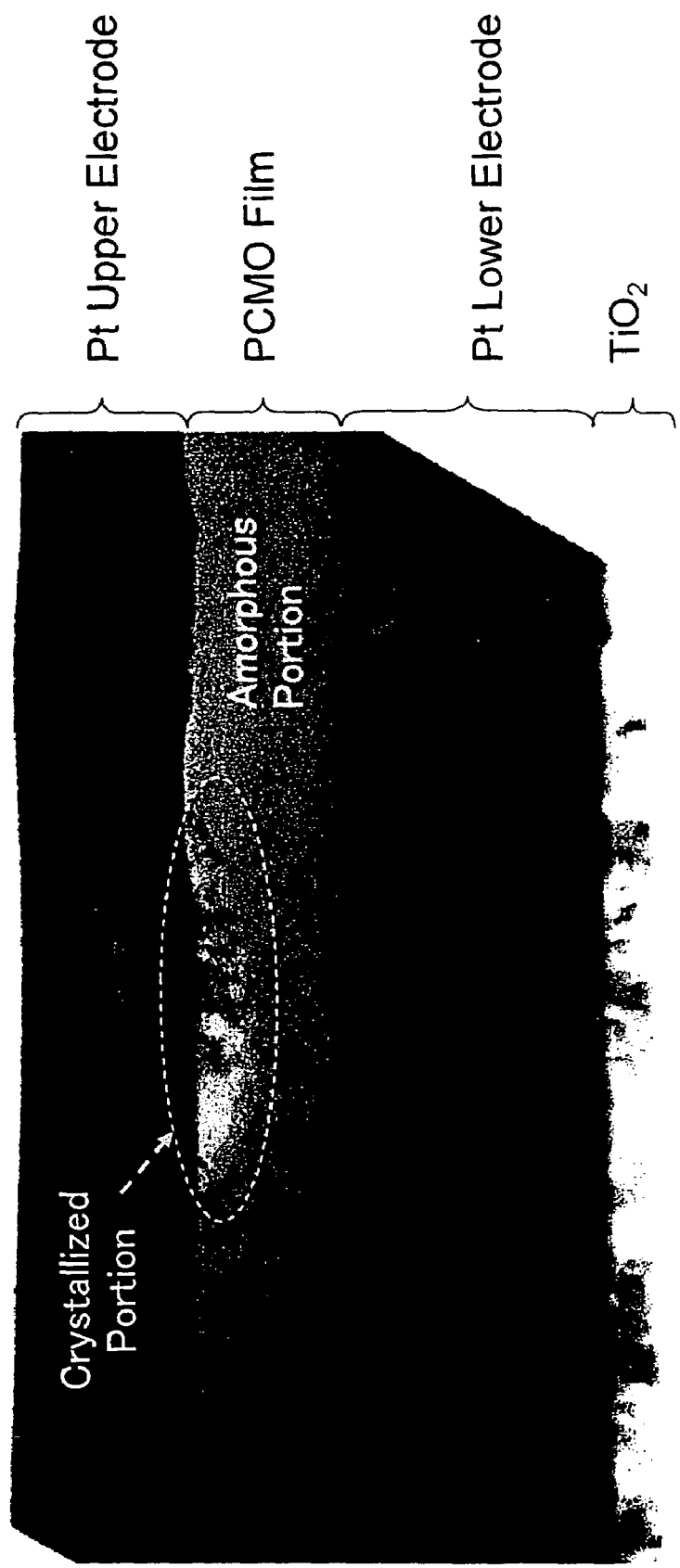
FIG. 7 is a cross-sectional TEM image of a variable resistance element in the case where a PCMO film is formed at 300° C. according to a sputtering method and, then, is subjected to an annealing process at 525° C. for 15 minutes in a nitrogen atmosphere.

FIGS. 6 and 7 are examples of a cross-sectional TEM image of the variable resistance element 10 where the variable resistor 8 is formed of a PCMO film. As shown in FIGS. 6 and 7, the variable resistance element 10 has the basic element structure shown in FIG. 2, and the variable resistor 8 is in the intermediate state, where crystal portions and amorphous portions are mixed.

FIG. 6 is a cross-sectional TEM image of the variable resistance element in the case where the PCMO film 8 is formed at 300° C. by a sputtering method and, then, is subjected to an annealing process at an annealing temperature of 500° C. in an oxygen atmosphere for an annealing period of time of 50 minutes, wherein a crystal region is partially formed in the amorphous film so as to range from the upper electrode to the lower electrode, and the structure can be seen where such partially crystallized regions are interspersed in the amorphous film. FIG. 7 is a cross-sectional TEM image of the variable resistance element in the case where the PCMO film 8 is formed at 300° C. by a sputtering method and, then, is subjected to an annealing process at an annealing temperature of 525° C. in a nitrogen atmosphere for an annealing period of time of 15 minutes, wherein a crystal region is partially formed in the amorphous film so as to range from the upper electrode to the middle of the variable resistor, and the structure can be seen where such partially crystallized regions are interspersed in the amorphous film. In addition, a case where microscopic crystal grains exist sporadically in the amorphous portion is also confirmed.

Next, a process for manufacturing the variable resistance element 10 will be described in the case where the variable resistor 8 where amorphism and crystallinity are mixed is formed according to the second formation method. Here, a process for manufacturing solely the variable resistance element 10, as opposed to together with a selection transistor in a memory cell, will be briefly described below.

Figure 8:
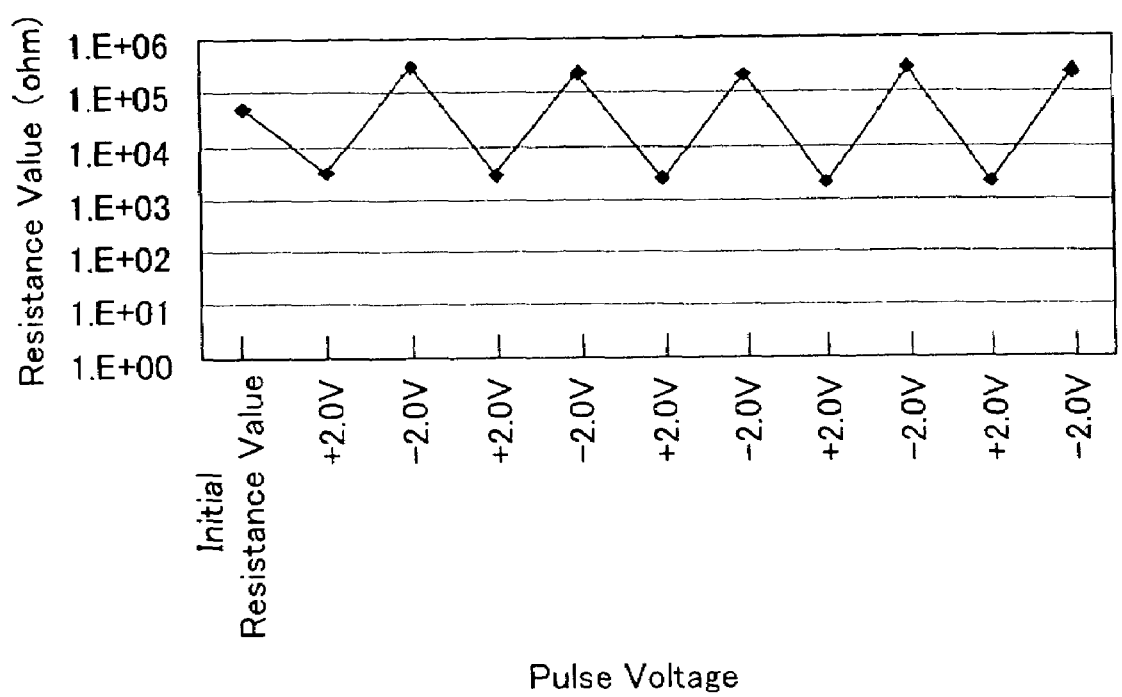
FIG. 8 is a diagram showing an example of the switching operation of the variable resistance element shown in FIG. 6.

First, Pt, which becomes a lower electrode, is deposited by a sputtering method, on top of a silicone oxide film and $TiO_2$ layered on a silicone substrate. Next, a PCMO film is formed on the lower Pt electrode film by a sputtering method at 300° C., so as to have a thickness of 100 nm and, then, is subjected to an annealing process at an annealing temperature of 500° C. for an annealing period of time of 15 minutes in an oxygen atmosphere. Pt, which becomes an upper electrode, is deposited on the top by a sputtering method. After that, the upper electrode, the PCMO film and the lower electrode are etched in sequence so as to form the structure of a variable resistance element. Then, an interlayer insulating film (silicon oxide film or the like) is deposited, in which contact holes reaching to the top surfaces of the lower electrode and the upper electrode are formed. Then, a metal, such as Al, is deposited and patterned for interconnect, involving the upper Pt electrode and the lower Pt electrode. It can be confirmed that the PCMO film that has been manufactured in the above-described manner has a structure where crystallinity and amorphism are mixed, as shown in FIG. 6. In addition, FIG. 8 shows an example of the switching operation of a variable resistance element where the PCMO film is formed to have dimensions of 50 μm×50 μm. The switching operation is performed by applying a voltage pulse (pulse width: 100 ns) having the two polarities, positive and negative, to the upper electrode, and by supplying a voltage of 0.8 V to the upper electrode after the application of each pulse. Thus, the current that flows between the upper electrode and the lower electrode can be measured so as to observe the change in the resistance value.

FIG. 3 shows the resistivity of PCMO films in the case where variable resistance elements are formed by a sputtering method at 300° C., 400° C., 450° C., 500° C. and 600° C., respectively, and then, are subjected to an annealing process at 600° C. for 15 minutes. In the case where a PCMO film that includes amorphous portions is formed at a film forming temperature from 300° C. to 500° C., it is confirmed that the resistivity lowers from the resistivity immediately after the film formation of the PCMO film, as a result of the annealing process at 600° C. for 15 minutes, and thus, a PCMO film where crystallinity and amorphism are mixed can be formed. As a result of this, it can be seen that the initial resistance value of a variable resistance element can be controlled by carrying out annealing process at a temperature that is same as the film forming temperature or more, after a PCMO film where amorphous portions exist has been formed by a sputtering method. In addition, it is confirmed that crystallized portions increase, and thereby, the resistivity lowers, by increasing the period of time for annealing. Thus, it can be seen that the initial resistance of a variable resistance element can be controlled with the period of time for annealing.

Next, an example of the configuration wherein memory cells, each of which is the same as the variable resistive element 10 that is fabricated in the above-described process, are arranged in array form so that a memory array 101 can be formed as the inventive device 100, which is a nonvolatile semiconductor memory device having a large capacity, is described with reference to the drawings.

Figure 9:
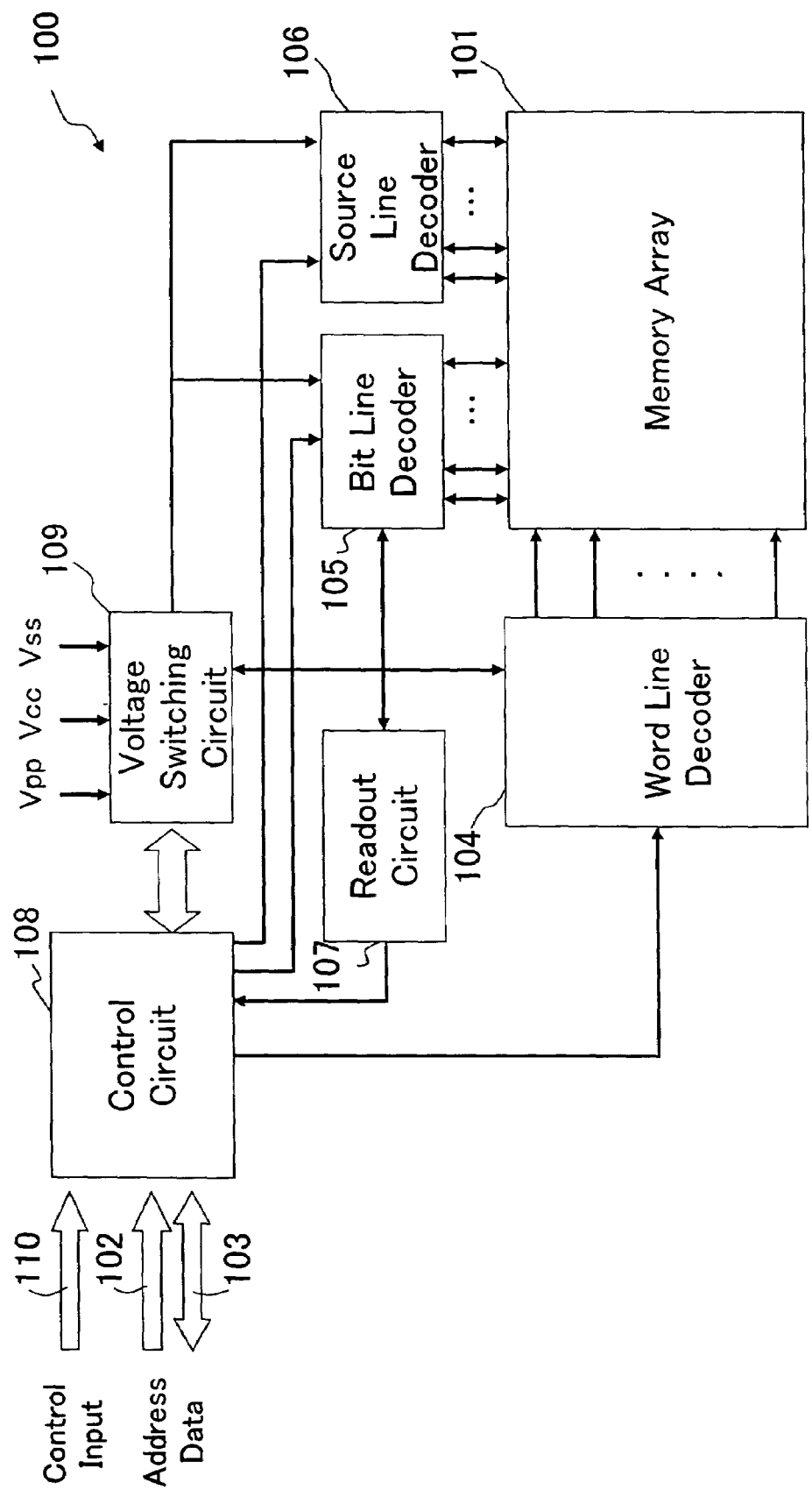
FIG. 9 is a block diagram showing the configuration of the entirety of the nonvolatile semiconductor memory device according to the present invention.

FIG. 9 shows a block diagram of the inventive device 100. Information is stored in the memory array 101 of the inventive device 100 where the memory array 101 has a configuration of a plurality of memory cells that is arranged as described above, and information can be stored in and read out from a memory cell within the memory array 101.

Figure 10:
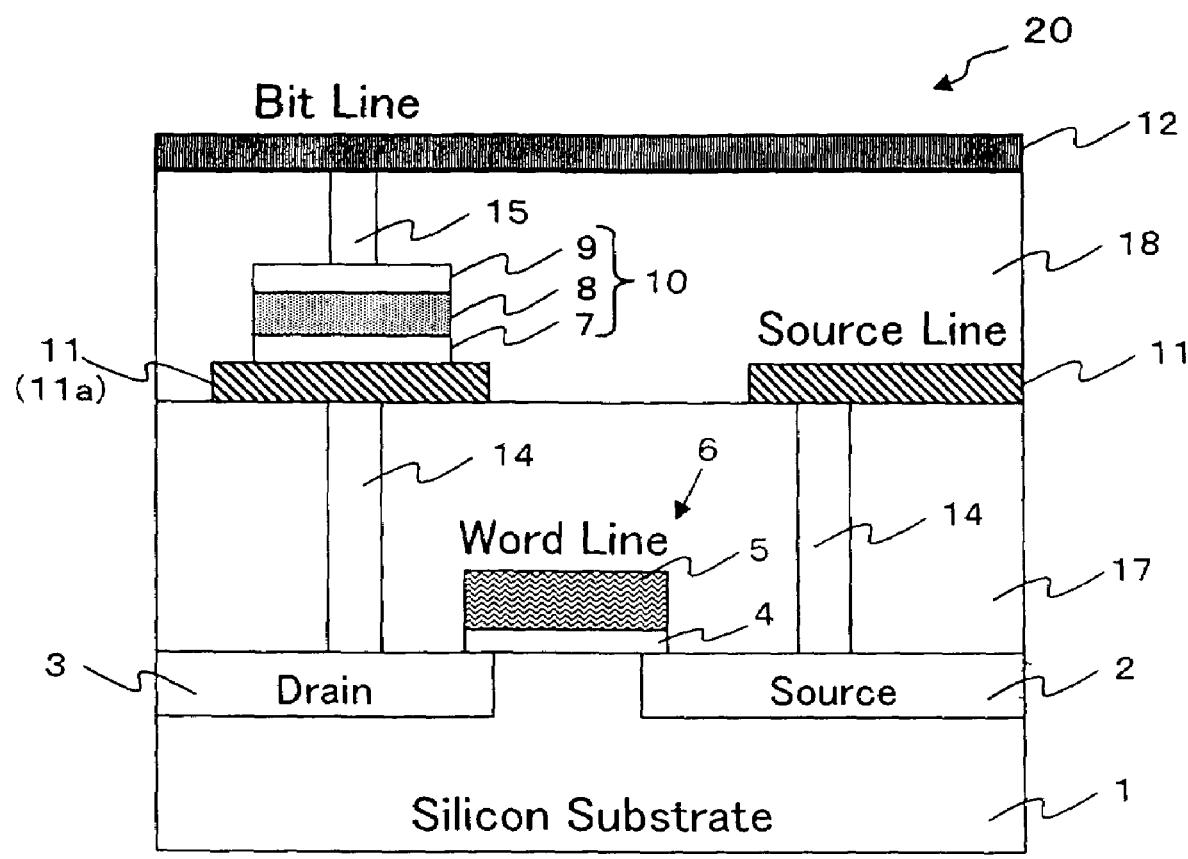
FIG. 10 is a cross sectional diagram schematically showing another example of the memory cell structure that is used in the nonvolatile semiconductor memory device according to the present invention.

FIG. 10 shows a schematic diagram of a cross section of the memory cell 20 that forms the memory array 101. As shown in FIG. 10, the memory cell 20 is formed of a source region 2 and a drain region 3 that have been formed on a semiconductor substrate 1; a selective transistor 6 made of a gate electrode 5 that has been formed on a gate oxide film 4; and a variable resistive element 10 where a variable resistor 8 of which the resistive value changes depending on an applied voltage is placed between a lower electrode 7 and an upper electrode 9, wherein the drain region 3 and the lower electrode 7 are electrically connected in series. In addition, the upper electrode 9 is connected to a second layer metal interconnect 12 which is used as a bit line; the gate electrode 5 is connected to a word line; and the source region is connected to a diffusion layer or a first layer metal interconnect 11 which becomes a source line. The variable resistive element 10 is formed in the same manner as the single variable resistive element 10 shown in FIG. 2. This memory cell configuration differs from that illustrated in FIG. 4 in the way that the single memory cell is formed of one variable resistive element 10. The number of the variable resistive elements 10 arranged within one memory cell may be determined in accordance with the characteristics and functions of the entire configuration of the memory device.

Figure 11:
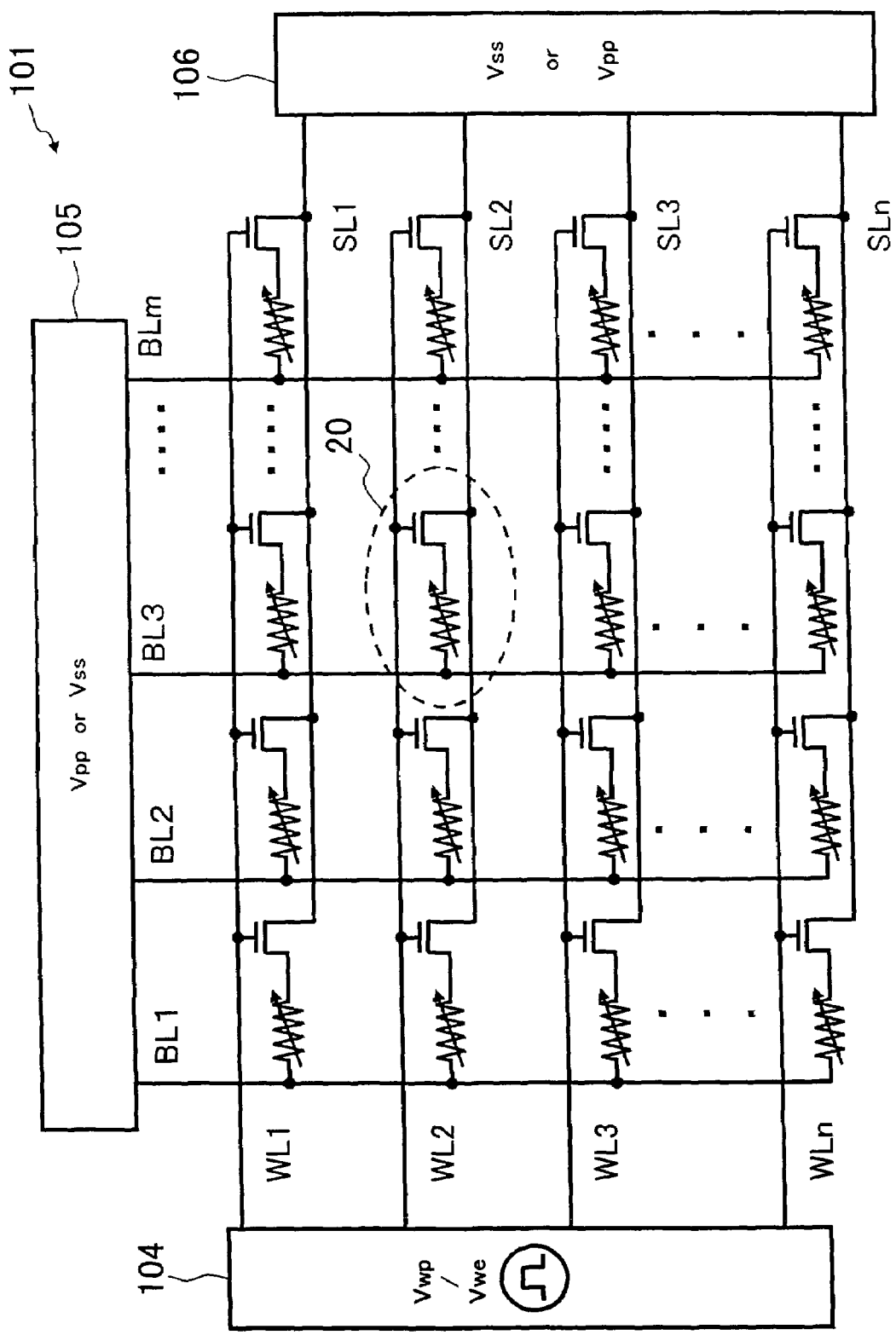
FIG. 11 is a circuit diagram showing an example of the configuration of the memory array that is used in the nonvolatile semiconductor memory device according to the present invention.

FIG. 11 schematically shows an example of the configuration of the memory array 101. In this configuration, the memory array 101 has m×n memory cells 20 at intersections of m bit lines (BL1 to BLm) and n word lines (WL1 to WLn). In addition, n source lines (SL1 to SLn) are placed in parallel to the word lines in the configuration. Here, the configuration of the memory array 101 is not limited to that of FIG. 11.

As described above, a memory cell 20 is formed of a series circuit of a selective transistor 6 and a variable resistive element 10 and thereby, the selective transistor 6 of the memory cell 20, which is selected by the potential of a word line, is turned ON and in addition, a program or erasure voltage is selectively applied to only the variable resistive element 10 of the memory cell 20 which has been selected by the potential of a bit line, and thereby, the resistance value of the variable resistor 8 in the variable resistive element 10 is changed in the configuration.

The block configuration that includes the peripheral circuits of the inventive device 100 shown in FIG. 9 is the same as or similar to the block configuration of a general nonvolatile semiconductor memory device. The each circuit blocks are briefly described below. Information is stored in a specific memory cell within the memory array 101 that corresponds to the address that has been inputted from the address line 102 and this information passes through the data line 103 so as to be outputted to an external device. A word line decoder 104 selects a word line of the memory array 101 which corresponds to the signal that has been inputted to the address line 102 and a bit line decoder 105 selects a bit line of the memory array 101 which corresponds to the address signal that has been inputted to the address line 102 and furthermore, a source line decoder 106 selects a source line of the memory array 101 which corresponds to the address signal that has been inputted to the address line 102. A control circuit 108 controls program, erasure and readout of the memory array 101. The control circuit 108 controls readout, program and erasure operations of the word line decoder 104, the bit line decoder 105, the source line decoder 106, the voltage switching circuit 109 and the memory array 101 based on the address signal that has been inputted from the address line 102, the data input (at the time of program) that has been inputted from the data line 103 and control input signal that has been inputted from the control signal line 110. In the example shown in FIG. 1, the control circuit 108 has functions as a general address buffer circuit, a data input/output buffer circuit and a control input buffer circuit (not shown).

The voltage switching circuit 109 supplies voltages to a word line, a bit line and a source line which are required at the time of readout, program and erasure of the memory array 101. Vcc indicates a supply voltage to the device, Vss indicates a ground voltage and Vpp indicates a voltage for program and erasure. In addition, data readout is carried out through the bit line decoder 105 and the readout circuit 107 from the memory array 101. The readout circuit 107 determines the condition of data and this result is sent to the control circuit 108 so as to be outputted to the data line 103.

Here, the block configuration of the inventive device 100 and the configuration of a memory cell illustrated in FIG. 9 are examples and can appropriately be modified in accordance with the characteristics and the like of the variable resistive element 10. For example, the memory cell 20 may be formed of a single variable resistive element 10 instead of being formed of a series circuit of the selective transistor 6 and the variable resistive element 10. Alternatively, a selective diode may be used in place of the selective transistor 6.

As described in detail above, in the nonvolatile semiconductor memory device according to the present invention, crystallinity and amorphism are mixed in the variable resistor made of a perovskite-type metal oxide film that forms the variable resistance element and thereby, the initial resistance value can be adjusted to an initial resistance value in the range that allows for an appropriate switching operation of the nonvolatile semiconductor memory device by controlling the film forming temperature or the annealing conditions. Thus, it becomes possible to set an initial resistance value of the variable resistance element needed for appropriate operation in accordance with the required properties without changing the geometrical dimensions of the variable resistor, such as the film thickness.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   a variable resistance element including a variable resistor of a perovskite-type metal oxide film, wherein
   crystal portions and amorphous portions of the variable resistor are mixed and the crystal portions are interspersed in the amorphous portions.

2. The nonvolatile semiconductor memory device according to claim 1, wherein
   the variable resistance element includes a lower electrode, the variable resistor and an upper electrode, which are layered in sequence.

3. The nonvolatile semiconductor memory device according to claim 1, wherein
   the variable resistor is a praseodymium-calcium-manganese oxide represented by a general formula, $Pr_{1-x}Ca_xMnO_3$.

4. The nonvolatile semiconductor memory device according to claim 1, wherein
   the variable resistor is formed in a layer above a lowest metal interconnect layer of the device.

5. The nonvolatile semiconductor memory device according to claim 1, wherein
   the variable resistor is of a praseodymium-calcium-manganese oxide represented by a general formula, $Pr_{1-x}Ca_xMnO_3$.

* * * * *